(12) United States Patent
Liu et al.

(10) Patent No.: US 7,586,145 B2
(45) Date of Patent: Sep. 8, 2009

(54) EEPROM FLASH MEMORY DEVICE WITH JAGGED EDGE FLOATING GATE

(75) Inventors: Yuan-Hung Liu, Hsin-Chu (TW); Shih-Chi Fu, Taipei (TW); Chi-Hsin Lo, Hsin-Chu (TW); Chia-Shiung Tsai, Hsin-Chu (TW)

(73) Assignee: Taiwan Semiconductor Manufacturing Co. Ltd, Hsin-Chu (TW)

( * ) Notice: Subject to any disclaimer, the term of this patent is extended or adjusted under 35 U.S.C. 154(b) by 369 days.

(21) Appl. No.: 11/191,437

(22) Filed: Jul. 27, 2005

(65) Prior Publication Data

US 2007/0023816 A1 Feb. 1, 2007

(51) Int. Cl.
*H01L 29/76* (2006.01)
*H01L 29/788* (2006.01)
*H01L 29/792* (2006.01)

(52) U.S. Cl. .................. 257/317; 257/314; 257/315; 257/316; 257/318; 257/319; 257/320; 257/321; 257/322; 257/323; 257/324; 257/325; 257/326; 257/E29.3

(58) Field of Classification Search ......... 257/314–326, 257/E29.3
See application file for complete search history.

(56) References Cited

U.S. PATENT DOCUMENTS

| 4,701,776 | A | * | 10/1987 | Perlegos et al. | ............. 257/321 |
|---|---|---|---|---|---|
| 4,706,102 | A | * | 11/1987 | Pan et al. | ............. 365/185.06 |
| 4,763,299 | A | * | 8/1988 | Hazani | .................. 365/185.14 |
| 4,933,904 | A | * | 6/1990 | Stewart et al. | ......... 365/185.02 |
| 5,087,583 | A | * | 2/1992 | Hazani | ........................ 438/260 |
| 5,321,284 | A | * | 6/1994 | Scott et al. | .................. 257/282 |
| 5,544,103 | A | * | 8/1996 | Lambertson | ........... 365/185.15 |
| 5,633,184 | A | * | 5/1997 | Tamura et al. | ............. 438/264 |
| 5,677,216 | A | * | 10/1997 | Tseng | ........................ 438/259 |
| 5,879,992 | A | * | 3/1999 | Hsieh et al. | ................. 438/264 |
| 6,034,395 | A | * | 3/2000 | Tripsas et al. | ................ 257/316 |
| 6,229,176 | B1 | * | 5/2001 | Hsieh et al. | .................. 257/316 |
| 6,236,082 | B1 | * | 5/2001 | Kalnitsky et al. | ........... 257/315 |
| 6,242,308 | B1 | * | 6/2001 | Hsieh et al. | ................. 438/265 |
| 6,596,588 | B2 | * | 7/2003 | Chou | ........................ 438/259 |
| 6,630,381 | B1 | * | 10/2003 | Hazani | ........................ 438/260 |
| 6,649,472 | B1 | * | 11/2003 | Hsieh | ........................ 438/257 |
| 6,649,967 | B2 | * | 11/2003 | Na et al. | ...................... 257/315 |
| 6,656,796 | B2 | * | 12/2003 | Chan et al. | ................... 438/266 |
| 6,693,010 | B1 | * | 2/2004 | Mirgorodski | ............... 438/257 |
| 6,710,396 | B1 | * | 3/2004 | Wu | ............................. 257/315 |
| 6,746,920 | B1 | * | 6/2004 | Wen et al. | .................... 438/257 |
| 6,747,310 | B2 | * | 6/2004 | Fan et al. | ...................... 257/320 |
| 6,767,792 | B1 | * | 7/2004 | Wen et al. | .................... 438/257 |
| 6,847,068 | B2 | * | 1/2005 | Chuang et al. | .............. 257/260 |
| 6,849,506 | B2 | * | 2/2005 | Na et al. | ...................... 438/264 |
| 6,861,306 | B1 | * | 3/2005 | Hopper et al. | .............. 438/201 |
| 6,865,099 | B2 | * | 3/2005 | Tran et al. | ...................... 365/63 |
| 6,908,814 | B2 | * | 6/2005 | Jeng et al. | .................... 438/257 |
| 7,118,969 | B2 | * | 10/2006 | Chung et al. | ................ 438/265 |
| 7,180,127 | B2 | * | 2/2007 | Chen et al. | .................. 257/317 |
| 7,190,018 | B2 | * | 3/2007 | Chen et al. | .................. 257/315 |
| 2005/0287740 | A1 | * | 12/2005 | Wu et al. | ..................... 438/257 |

* cited by examiner

*Primary Examiner*—Ida M Soward
(74) *Attorney, Agent, or Firm*—Tung & Associates

(57) ABSTRACT

An EEPROM flash memory device having a floating gate electrode enabling a reduced erase voltage and method for forming the same, the floating gate electrode including an outer edge portion including multiple charge transfer pointed tips.

25 Claims, 6 Drawing Sheets

EEPROM FLASH MEMORY DEVICE WITH JAGGED EDGE FLOATING GATE

FIELD OF THE INVENTION

This invention generally relates to semiconductor device structures and methods for forming the same, and more particularly to a method for forming an EEPROM flash memory device having a floating gate electrode including a jagged edge with multiple charge transfer points achieving improved erase voltage performance.

BACKGROUND OF THE INVENTION

In flash EEPROM (Electrically Erasable Programmable Read Only Memory) devices, the level of voltage required to transfer charge to or from a floating gate electrode through insulating layers to accomplish write and erase operation is critical to the successful operation of flash EEPROM devices. For example, reducing a required voltage necessary for erase operations would be advantageous in terms of power requirements and design constraints including critical dimensions of a flash EEPROM device.

It is known that the profile of gate structures can affect the hot electron injection processes or Fowler-Nordheim tunneling processes. An unacceptable gate profile may adversely affect the stability of a floating gate structure thereby adversely affecting the reliability of write and erase operations. For example, the electric field strength present at a polysilicon gate electrode/insulator interface determines the desired flow of current in response to applied voltages to accomplish write and erase operations.

In certain flash EEPROM structures, for example employing a floating gate and self-aligned control gate in a split gate FET configuration, a consistent and predictable profile of the gate structure is critical to proper electrical functioning of the device. As design rules have decreased to below about 0.25 micron technology, forming acceptable control and floating gate electrode profiles to accomplish write and erase operations has become increasingly difficult, with increasingly narrow process margins.

There is therefore a continuing need in the EEPROM device processing art to develop improved EEPROM devices and methods for forming the same to achieve improve device performance and reliability as well as improving process margins to enable scaled down memory cell size.

It is therefore an object of the invention to provide improved EEPROM devices and methods for forming the same to achieve improve device performance and reliability as well as improving process margins to enable scaled down memory cell size.

SUMMARY OF THE INVENTION

To achieve the foregoing and other objects, and in accordance with the purposes of the present invention as embodied and broadly described herein, the present invention provides an EEPROM flash memory device with a reduced erase voltage and method for forming the same.

In a first embodiment the EEPROM flash memory device includes a floating gate electrode including an outer edge portion comprising multiple charge transfer pointed tips.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to an exemplary embodiment including the formation of a split gate flash memory device, it will be appreciated that the method of the present invention may be advantageously used in the formation of any polysilicon gate electrode structure where the profile of the polysilicon gate electrode may be advantageously formed with a jagged edge portion including multiple tip to accomplish charge transfer to or from the gate structure.

Figure 1A:
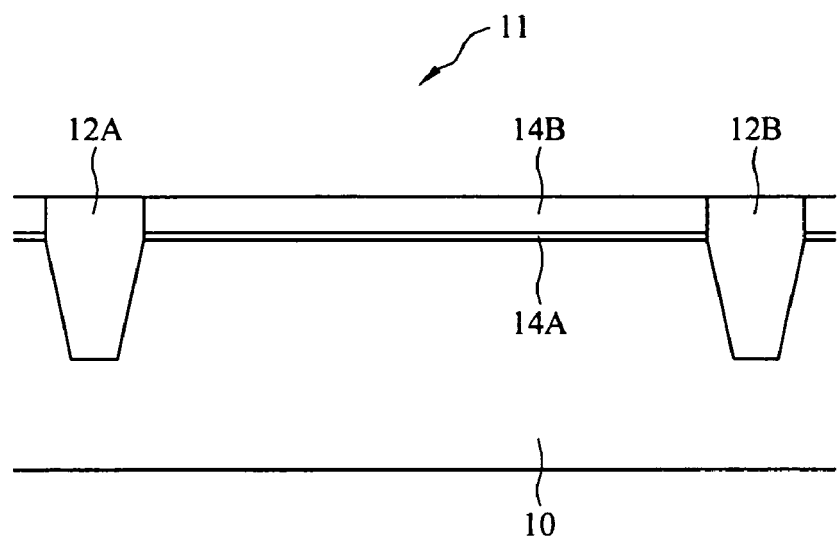
FIGS. 1A-1G are cross sectional schematic views of a portion of an exemplary EEPROM flash memory device at stages in manufacture according to an embodiment of the present invention.

For example, referring to FIGS. 1A-1G is shown portions of an exemplary EEPROM flash memory device at stages of production. Referring to FIG. 1A is a semiconductor substrate, 10, including an active area portion 11, of an EEPROM flash memory cell, having shallow trench isolation (STI) structures 12A and 12B formed to electrically isolate the active area. For example, a gate dielectric (e.g., oxide) layer 14A (e.g., 45-100 Angstroms) is formed on the semiconductor substrate, e.g., silicon, followed by formation of an overlying polysilicon layer 14B (e.g., 1000-5000 Angstroms), followed by formation of an overlying hardmask (not shown), e.g., SiN. The silicon nitride layer is patterned and STI trenches are etched into the semiconductor substrate. The STI trenches are then backfilled with an insulator, e.g., HDP-CVD oxide and the surface planarized to stop on the SiN hardmask. The hardmask is then stripped by conventional processes leaving the gate dielectric layer 14A and the overlying polysilicon layer 14B.

It will be appreciated that the semiconductor substrate may include, but is not limited to, silicon, silicon on insulator (SOI), stacked SOI (SSOI), stacked SiGe on insulator (S-SiGeOI), SiGeOI, and GeOI, and combinations thereof. It will also be appreciated that the gate dielectric 14A may include, but is not limited to, doped or undoped silicon dioxide (e.g. nitrogen doped $SiO_2$) formed by conventional chemical, thermal, CVD, or plasma enhanced deposition methods.

Figure 1B:
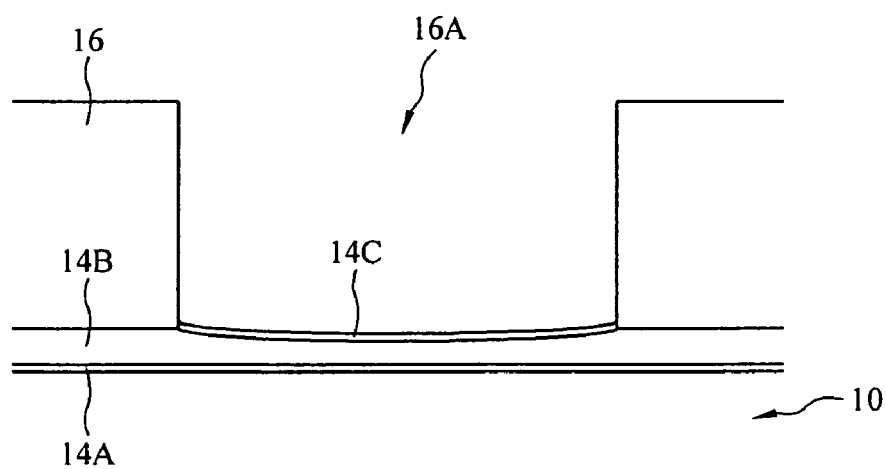

Referring to FIG. 1B, now showing a portion of the active area 11 bounded by the STI trenches (not shown), a dielectric masking layer 16, e.g. a nitride such as SiN or SiON is formed on the polysilicon layer 14B by conventional CVD methods (e.g., 3500-4500 Angstroms), then patterned by a conventional photolithographic process to form an etching mask, and then etched to form a patterned open area e.g., 16A exposing the underlying polysilicon layer 14B. A silicon dioxide ($SiO_2$) layer 14C is then thermally grown (e.g., 100-150 Angstroms) on the exposed polysilicon layer 14B upper portion.

Figure 1C:
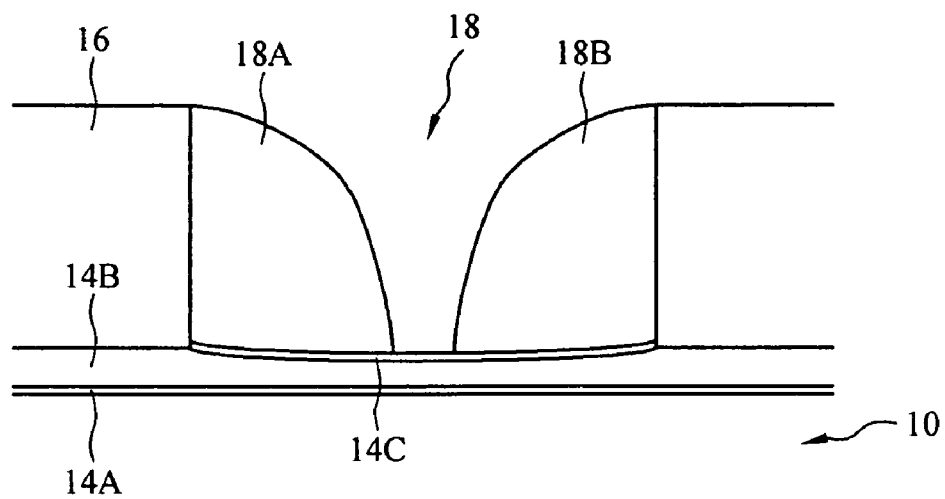

Referring to FIG. 1C, a dielectric insulator material, e.g., plasma enhanced (PE) silicon oxide (PE oxide) or TEOS oxide is then formed e.g., by PECVD, to backfill the open area 16A. The PE oxide is then etched by a dry etching process to form a second opening 18 and defining first insulator spacers 18A and 18B on either side of the second opening 18 e.g., having inwardly sloping sidewalls.

Figure 1D:
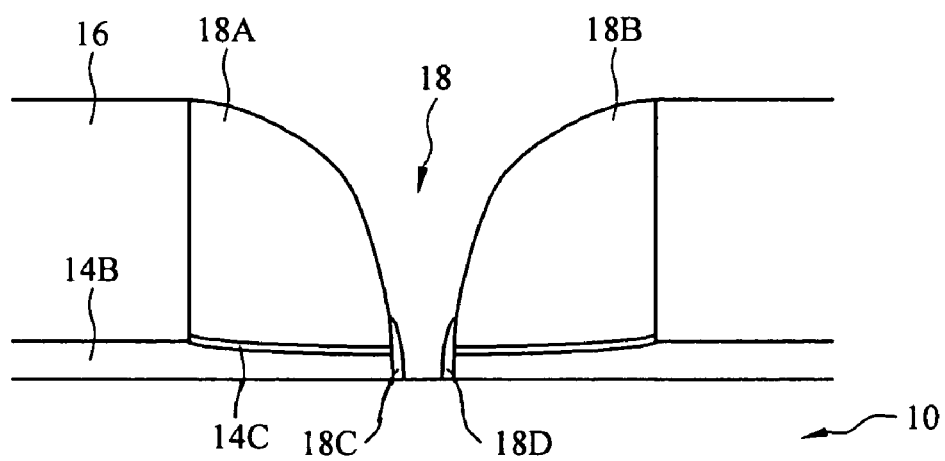

Referring to FIG. 1D, a polysilicon dry etching step is then carried out to etch through a thickness of the polysilicon layer 14B to extend the depth of opening 18 to the gate oxide layer 14A. A dielectric insulator such as silicon oxide is then deposited (e.g., CVD or PECVD) to include covering the exposed sidewall portions of the polysilicon layer 14B, and a dry etching process carried out to reopen the center portion of the opening 18 to the gate dielectric 14A to form a second set of dielectric insulator spacers, e.g., 18C and 18D, also referred to as VSS spacers, lining the bottom sidewall portions of opening 18, and exposing the gate oxide layer 14A.

Figure 1E:
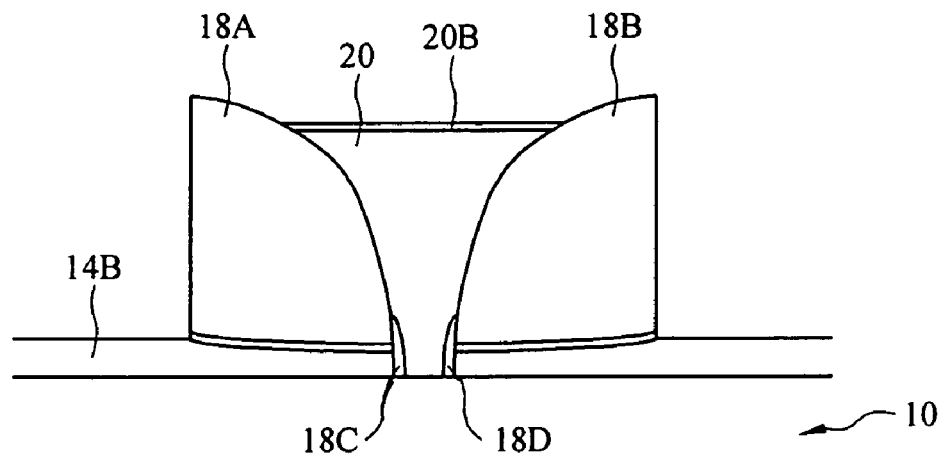

Referring to FIG. 1E, a polysilicon layer (film) is then formed e.g., by conventional furnace, CVD, or PECVD methods to fill the opening 18, followed by dry etching back of the polysilicon to a desired height (e.g., 2000-2500 Angstroms), preferably lower than the adjacent insulator spacers 18A and 18B, to form a central polysilicon electrode 20, also referred to as a VSS electrode. A thermal oxide ($SiO_2$) layer 20B (e.g., 125-175 Angstroms) is then formed e.g., thermally grown by conventional methods, on the upper portion of the VSS electrode 20. Still referring to FIG. 1E, the nitride mask layer 16 is then stripped by conventional processes, e.g., hot phosphoric acid to reveal the underlying polysilicon layer 14B.

Figure 1F:
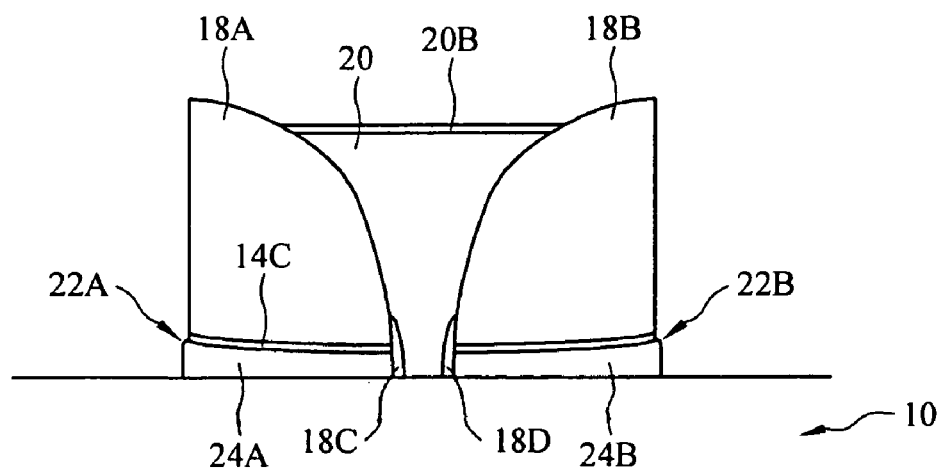
Figure 1G:
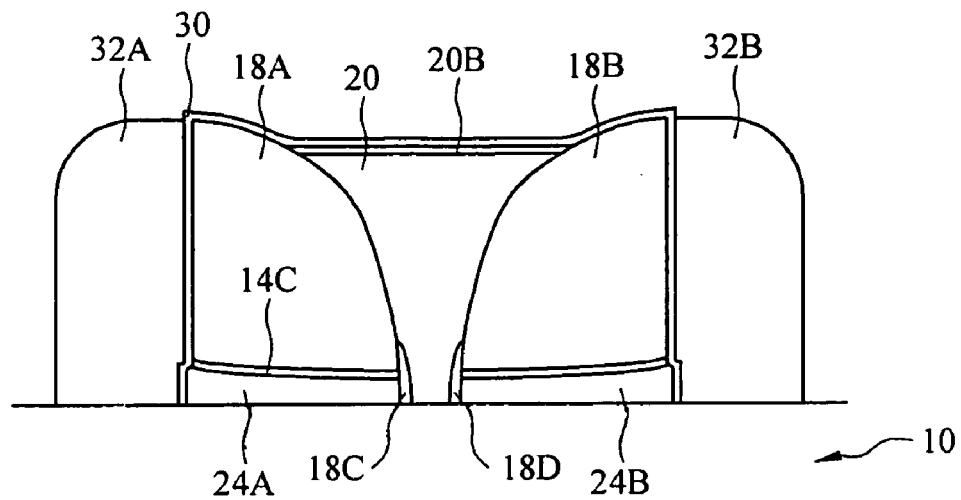

Referring to FIG. 1F, in an important aspect of the invention, the polysilicon layer 14B is then etched through a thickness to expose the gate dielectric layer 14A and form polysilicon floating gate (FLG) electrode portions 24A and 24B where the outer edge portions e.g., 22A and 22B of the FLG electrodes are formed having jagged edges including multiple pointed tips.

Figure 2A:
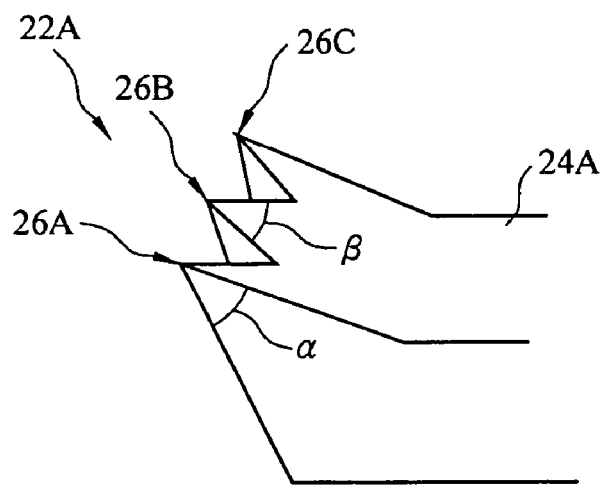
FIGS. 2A and 2B are expanded 3-dimensional views of exemplary edge portions of floating gate electrodes formed according to embodiments of the present invention.

For example, referring to FIG. 2A is shown an expanded view of an exemplary 3-dimension representation of a FLG electrode portion (shown alone for simplicity) e.g., 24A, including exemplary jagged edge portions e.g., 22A. For example, preferably, multiple pointed tip portions e.g., 26A, 26B, and 26C are formed to form the jagged outer edge portion e.g., 22A and 22B, of the floating gate electrodes. Exemplary pointed tipped portions preferably form an angle defined by the tip in the plane of the upper portion of the polysilicon layer (upward facing angled portion) having an angle $\beta$ of about 40-150 degrees and an angle defined by the tip in the plane of a thickness direction (side facing angled portion) having an angle $\alpha$ of about 30-75 degrees. It will be appreciated that tipped portions along the internal portion of the edge portion e.g., 26B, may have a larger $\beta$ angle (about twice as large) as the outer tips e.g., 26A and 26C. It will also be appreciated that there are preferably multiple pointed/angled (tipped) portions, preferably at least 3 pointed tip portions.

Figure 2B:
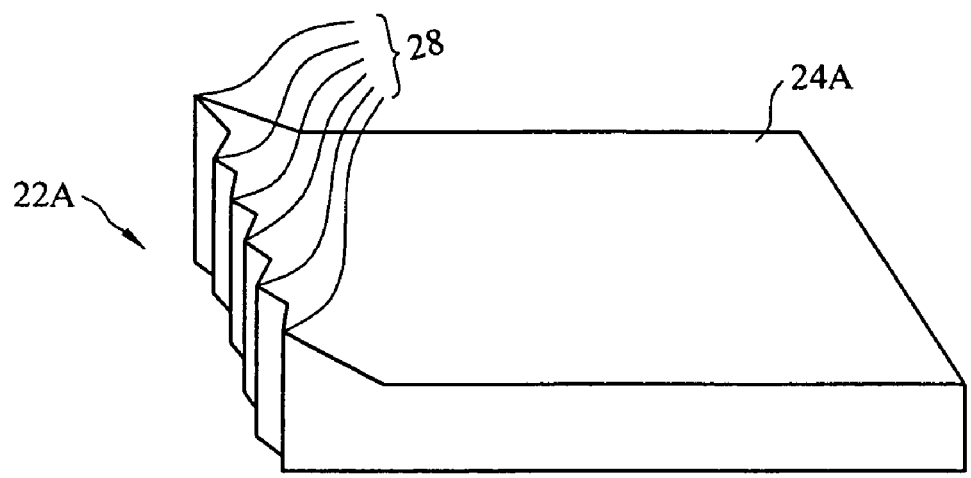

For example, referring to FIG. 2B is shown another exemplary 3-dimensional representation of a FLG portion e.g., 24A (shown alone for simplicity), having multiple pointed tip portions e.g., 28, to form a jagged outer edge portion e.g., 22A.

In an exemplary dry etching process to form the jagged edged portions 22A and 22B, a polymer-rich forming dry etching chemistry is preferably used. For example, polymer forming residues are formed during (in-situ) the etching process to cause preferential etching on portions of the FLG edge portions 22A and 22B, thereby causing a jagged edge to form. In a preferable etching process, an etching chemistry including plasma source gases of HBr, $O_2$, $Cl_2$, and optionally, a carbon rich fluorocarbon e.g., C/F ratio greater than about 2.5) Preferably a conventional DPS (dual plasma source) plasma reactor is used to allow independent adjustable RF power sources and bias power sources. Exemplary plasma etching conditions include a nitrogen containing sources gas include an RF power of about 150-250 Watts, a bias power of about 30-50 Watts, $Cl_2$ at about 150-250 sccm, HBr at about 100-200 sccm and $O_2$ at about 2-5 sccm. It will be appreciated that careful control of the etching chemistry as well as the power and bias sources are required to form the jagged edges with the desired geometry. In addition, the etching process may be carried out at reduced temperatures e.g., about 30° C. or lower to enhance in-situ polymer passivation layer formation during the polysilicon etching process.

It will additionally be appreciated that additional optional steps may include first forming an organic (polymer) layer on the polysilicon 14B layer surface (e.g., in-situ plasma formation) prior to commencing dry etching. It will also be appreciated that a polysilicon isotropic wet etching process may be carried out following the dry etching process to further refine a jagged edge geometry including multiple tipped portions.

Figure 3:
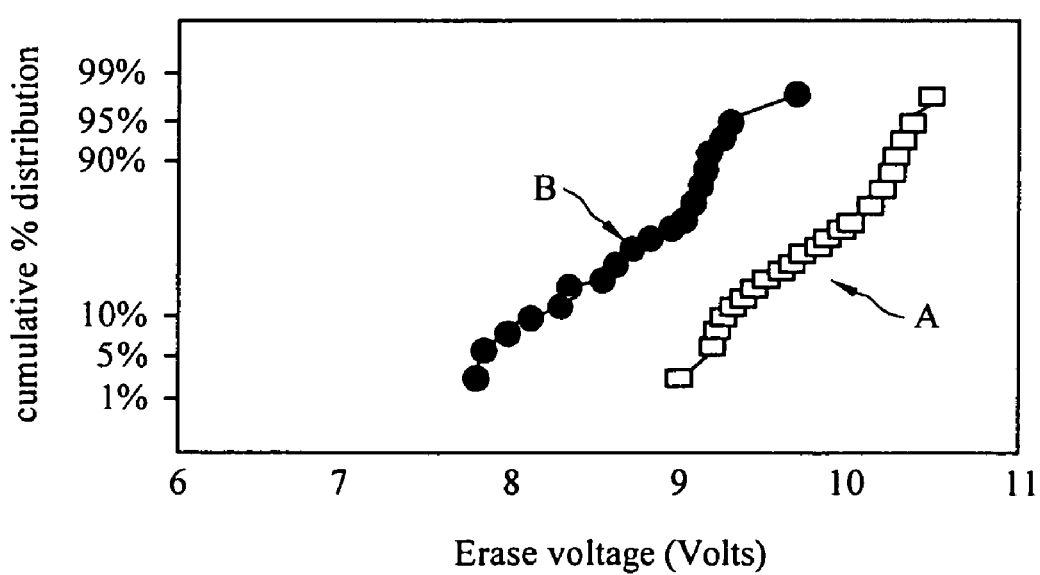
FIG. 3 is exemplary erase voltage achieved by EEPROM devices formed according to embodiments of the present invention.

Advantageously, the floating gate (FLG) electrode with a multiply tipped jagged edge according to the present invention, allows a reduced voltage in erase operations. For example, referring to FIG. 3 is shown exemplary experimental data showing erase Voltage on the horizontal (X) axis) and cumulative test results (% Cumulative distribution) on the vertical (Y) axis. Line A shows an erase voltage formed by a conventional FLG electrode without pointed tips (e.g., a substantially flat edge portion). In contrast, line B shows an erased voltage of a FLG electrode formed having multiply pointed tips forming a jagged edge according to preferred embodiments. Advantageously, the multiply tipped jagged edge FLG electrode has an erase voltage reduced up to about 15% compared to the substantially flat edge profile FLG electrode of the prior art.

Referring back to FIG. 1G, subsequent processes are then carried out to complete the split gate configuration EEPROM flash memory device. For example, a tunnel dielectric layer 30 (e.g., silicon oxide) is formed to encapsulate the device including over the jagged outer edge portions of the floating gate electrodes, followed by formation of an overlying polysilicon layer. A dry etching process is then carried out to form self aligned polysilicon wordlines 32A and 32B.

Figure 4:
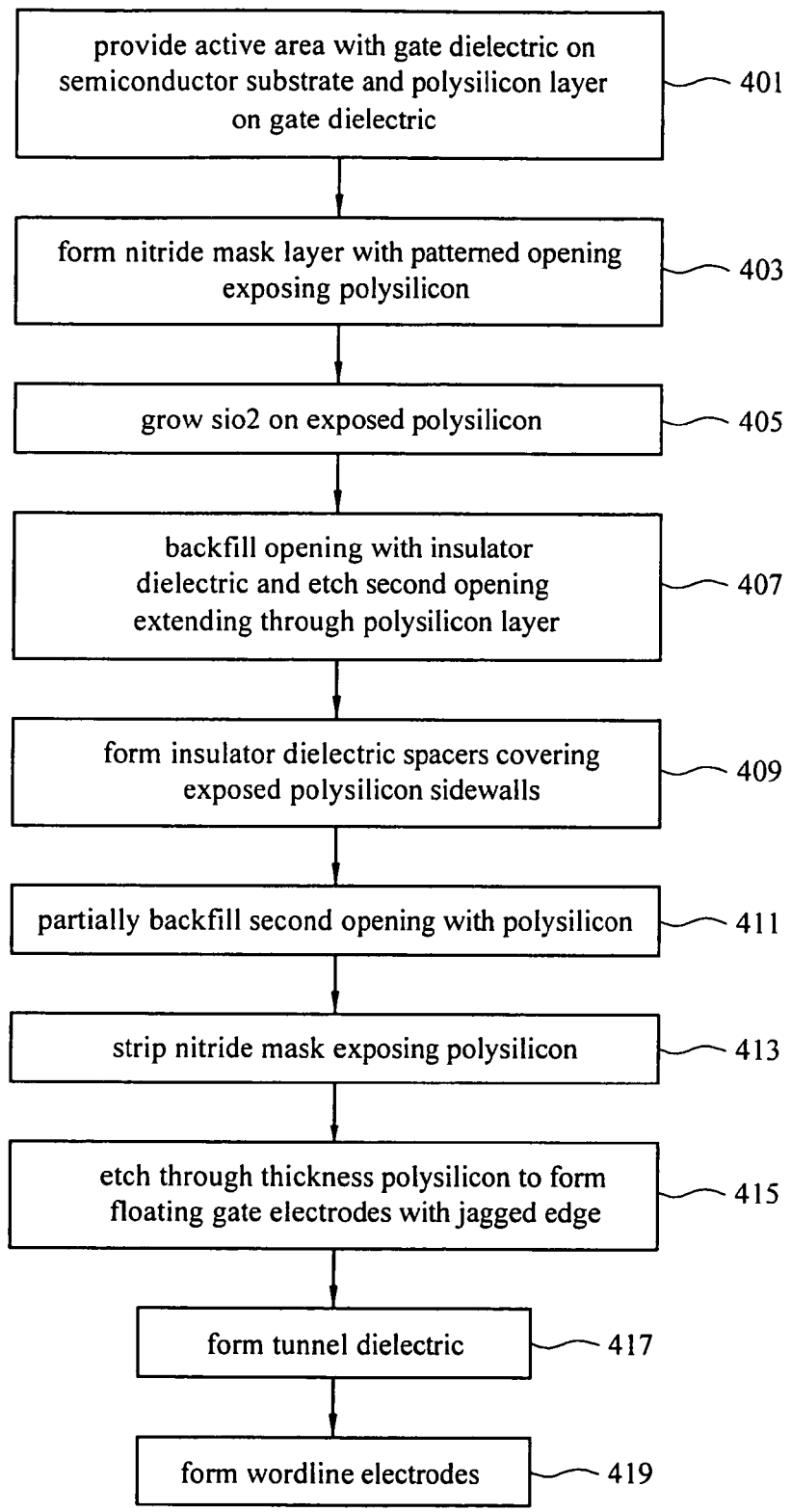
FIG. 4 is a process flow diagram including several embodiments of the present invention.

Referring to FIG. 4 is a process follow diagram including several embodiments of the present invention. In process 401, a semiconductor substrate is formed with an electrically isolated active area including a gate dielectric on the semiconductor substrate and a polysilicon layer on the gate dielectric. In process 403 a nitride mask is formed on the polysilicon layer with a first opening exposing the polysilicon layer. In process 405, a $SiO_2$ layer is grown on the exposed portion of the polysilicon layer. In process 407, a first insulator dielectric is deposited to backfill the opening and the insulator dielectric is etched through a thickness to form a second opening including extending through a thickness of the underlying polysilicon layer to form a first set of insulator dielectric spacers. In process 409, a second insulator dielectric is deposited to cover exposed sidewalls of the polysilicon layer to form a second set of insulator dielectric spacers. In process 411, the second opening is partially filled with polysilicon to form a central electrode. In process 413, the nitride mask layer is stripped to expose the polysilicon layer. In process 415, the polysilicon layer is etched through a thickness according to preferred embodiments to form floating gate electrodes underlying the first set of insulator dielectric spacers and having an outer jagged edge portion comprising multiple pointed tips. In process 417, a tunnel dielectric is formed to encapsulate the resulting structure including the floating gate electrodes. In process 419, wordline electrodes are formed adjacent the floating gate electrodes.

The preferred embodiments, aspects, and features of the invention having been described, it will be apparent to those skilled in the second art that numerous variations, modifications, and substitutions may be made without departing from the spirit of the invention as disclosed and further claimed below.

What is claimed is:

1. An EEPROM flash memory device comprising:
a floating gate electrode, said floating gate electrode comprising a jagged outer edge portion comprising multiple charge transfer pointed tips, said multiple charge transfer pointed tips comprising at least three pointed tips along a common outer upper edge of said floating gate electrode, said jagged outer edge portion comprising a sidewall of said floating gate electrode; and
wherein said jagged outer edge portion comprises peaks and valleys in said sidewall, said peaks and valleys having respective peak heights and valley bottoms extending longitudinally parallel to a height of said sidewall.

2. The EEPROM flash memory device of claim 1, wherein the multiple charge transfer pointed tips comprise adjacent peak and valley regions to form said jagged outer edge portion.

3. The EEPROM flash memory device of claim 1, wherein each of the multiple charge transfer pointed tips along the jagged outer edge portion define an angle β of about 40-150 degrees in a plane comprising an upward facing portion of the floating gate electrode.

4. The EEPROM flash memory device of claim 1, wherein each of the multiple charge transfer pointed tips along the jagged outer edge portion define an angle α of about 30-75 degrees in a plane comprising a thickness portion of the floating gate electrode.

5. The EEPROM flash memory device of claim 1, wherein the jagged outer edge portion has a greater thickness than an inner portion of the floating gate electrode.

6. The EEPROM flash memory device of claim 1, wherein the floating gate electrode comprises one of a pair of floating gate electrodes disposed on either side of a central electrode separated by an insulator dielectric.

7. The EEPROM flash memory device of claim 1, further comprising a wordline electrode adjacent the floating gate electrode separated by a tunnel dielectric.

8. The EEPROM flash memory device of claim 1, wherein the floating gate electrode comprises polycrystalline silicon.

9. The EEPROM flash memory device of claim 1, further comprising a second insulator dielectric disposed overlying the floating gate electrodes on either side of a central electrode.

10. The EEPROM flash memory device of claim 9, wherein the central electrode comprises a VSS electrode.

11. An EEPROM flash memory device comprising:
floating gate electrodes disposed adjacently on either side of a central electrode, said floating gate electrodes separated from the central electrode by dielectric insulator spacers;
wordline electrodes disposed adjacently on either side of the floating gate electrodes, said wordline electrodes separated from the floating gate electrodes by tunnel dielectric spacers;
wherein, each of said floating gate electrodes comprise a jagged outer edge portion comprising multiple charge transfer pointed tips, said jagged outer edge portion comprising a sidewall of said floating gate electrode; and
wherein said jagged outer edge portion comprises peaks and valleys in said sidewall, said peaks and valleys having respective peak heights and valley bottoms extending longitudinally parallel to a height of said sidewall.

12. The EEPROM flash memory device of claim 11, wherein the multiple charge transfer pointed tips comprise at least three pointed tips.

13. The EEPROM flash memory device of claim 11, wherein the multiple charge transfer pointed tips comprise adjacent peak and valley regions to form said jagged outer edge portion.

14. The EEPROM flash memory device of claim 11, wherein each of the multiple charge transfer pointed tips along the jagged outer edge portion define an angle β of about 40-150 degrees in a plane comprising an upward facing portion of the floating gate electrode.

15. The EEPROM flash memory device of claim 11, wherein each of the multiple charge transfer pointed tips along the jagged outer edge portion define an angle α of about 30-75 degrees in a plane comprising a thickness portion of the floating gate electrode.

16. The EEPROM flash memory device of claim 11, wherein the floating gate electrode comprises polycrystalline silicon.

17. The EEPROM flash memory device of claim 11, wherein the floating gate electrode comprises one of a pair of floating gate electrodes disposed on either side of a central electrode separated by an insulator dielectric.

18. The EEPROM flash memory device of claim 11, further comprising a wordline electrode adjacent the floating gate electrode separated by a tunnel dielectric.

19. The EEPROM flash memory device of claim 11, further comprising a second insulator dielectric disposed overlying the floating gate electrodes on either side of a central electrode.

20. The EEPROM flash memory device of claim 19, wherein the central electrode comprises a VSS electrode.

21. A method for forming an EEPROM flash memory device comprising the steps of:
forming a floating gate electrode, said floating gate electrode comprising a jagged outer edge portion comprising multiple charge transfer pointed tips, said multiple charge transfer pointed tips comprising at least three pointed tips along a common outer upper edge of said floating gate electrode, said jagged outer edge portion comprising a sidewall of said floating gate electrode;
wherein said jagged outer edge portion comprises peaks and valleys in said sidewall, said peaks and valleys having respective peak heights and valley bottoms extending longitudinally parallel to a height of said sidewall.

22. The method of claim 21, wherein the jagged outer edge portion has a greater thickness than a central portion of the floating gate electrode.

23. The method of claim 21, further comprising the step of forming a polysilicon wordline electrode adjacent the floating gate electrode, said wordline electrode separated from the floating gate electrode by a tunnel dielectric.

24. The method of claim 21, wherein the floating gate electrode is formed to have a reduced erase voltage compared to an outer edge portion without the multiple charge transfer pointed tips.

25. A method for forming an EEPROM flash memory device with a reduced erase voltage comprising:
forming floating gate electrodes disposed adjacently on either side of a central electrode, said floating gate electrodes separated from the central electrode by dielectric insulator spacers;

forming wordline electrodes disposed adjacently on either side of the floating gate electrodes, said wordline electrodes separated from the floating gate electrodes by tunnel dielectric spacers;

wherein, each of said floating gate electrodes are formed comprising a jagged outer edge portion comprising multiple charge transfer pointed tips, said jagged outer edge portion comprising a sidewall of said floating gate electrode; and, wherein said jagged outer edge portion comprises peaks and valleys in said sidewall, said peaks and valleys having respective peak heights and valley bottoms extending longitudinally parallel to a height of said sidewall.

* * * * *